United States Patent [19]

Meyers

[11] Patent Number: 5,036,517
[45] Date of Patent: Jul. 30, 1991

[54] TARGET ILLUMINATORS AND SYSTEMS EMPLOYING SAME

[76] Inventor: Brad E. Meyers, c/o B.E. Meyers Co., Inc., 17525 N.E. 67th Ct., Redmond, Wash. 98052

[21] Appl. No.: 590,937

[22] Filed: Oct. 1, 1990

Related U.S. Application Data

[62] Division of Ser. No. 489,280, Mar. 2, 1990, Pat. No. 4,991,183.

[51] Int. Cl.$^5$ .................................................. H01S 3/13
[52] U.S. Cl. ............................................. 372/29; 372/38; 372/107; 372/108; 250/504 R; 250/504 H; 250/493.1; 362/259; 362/183; 362/295
[58] Field of Search ............... 372/29, 38, 108, 109, 372/107, 65; 250/504 R, 504 H, 493.1; 362/183, 359, 295

[56] References Cited

U.S. PATENT DOCUMENTS

| 3,454,898 | 7/1969 | Comstock . |
| 3,787,693 | 1/1974 | Stone . |
| 3,833,805 | 9/1974 | Naiman et al. . |
| 3,867,764 | 2/1975 | Dunmire et al. . |
| 4,079,534 | 3/1978 | Snyder . |
| 4,101,957 | 7/1978 | Chang . |
| 4,112,300 | 9/1978 | Hall, Jr. et al. . |
| 4,129,780 | 12/1978 | Laughlin . |
| 4,226,529 | 10/1980 | French . |
| 4,266,873 | 5/1981 | Hacskaylo et al. . |
| 4,293,892 | 10/1981 | Plummer . |
| 4,315,150 | 2/1982 | Darringer et al. . |
| 4,561,775 | 12/1985 | Patrick et al. . |
| 4,707,595 | 11/1987 | Meyers . |
| 4,738,044 | 4/1988 | Osterhout . |
| 4,853,529 | 8/1989 | Meyers . |
| 4,916,713 | 4/1990 | Gerber .................. 372/107 |
| 4,991,183 | 2/1991 | Meyers .................. 372/65 |

*Primary Examiner*—Léon Scott, Jr.
*Attorney, Agent, or Firm*—Hughes & Multer

[57] ABSTRACT

Devices for illuminating a target with a beam of coherent energy. The device has a number of applications. In one, it is employed with a night vision system to make available additional energy which can be utilized by an image intensifier in the night vision system in producing a visual image of a target acquired by the night vision system.

9 Claims, 5 Drawing Sheets

TARGET ILLUMINATORS AND SYSTEMS EMPLOYING SAME

RELATED APPLICATION

This application is a division of application Ser. No. 489,280 filed Mar. 2, 1990 and now U.S. Pat. No. 4,991,183 and entitled TARGET ILLUMINATORS AND SYSTEMS EMPLOYING SAME.

TECHNICAL FIELD OF THE INVENTION

In one aspect, the present invention relates to novel devices for illuminating a target with a coherent beam of radiant energy in a near visible part of the electromagnetic spectrum.

In a second, and also important, aspect, the present invention relates to novel, improved night vision systems which include an image intensifier and a device for illuminating a target acquired by the system with a beam of coherent radiant energy, thereby making available additional energy which can be converted by the image intensifier into a visual image of the target.

In the interest of brevity and clarity, the principles of the present invention will be developed to a large extent with reference to a night vision system as defined in the preceding paragraph. This is not intended to limit the scope of the invention as defined in the preceding claims, however, as there are many other applications of laser illuminators employing those principles. For example, they may be employed with the aiming systems of individual and crew served weapons to make it possible to accurately aim such weapons to make it possible to accurately aim such weapons under adverse light conditions.

INCORPORATION BY REFERENCE

The following are hereby incorporated by reference into this specification.

U.S. Pat. No. 4,707,595 issued Nov. 17, 1987 to Meyers for INVISIBLE LIGHT BEAM PROJECTOR AND NIGHT VISION SYSTEM.

U.S. Pat. No. 4,853,529 issued Aug. 1, 1989 to Meyers for LIGHT LEVEL RESPONSIVE CONTROL FOR LIGHT INTENSIFIER IN NIGHT VISION SYSTEM.

BACKGROUND OF THE INVENTION

The type of night vision system with which the present invention is concerned makes use of an image intensifier to convert small amounts of available light (for example starlight) by electron multiplication to an image which can be viewed by the human eye, recorded on film or video tape, etc.

A state-of-the-art night vision system of this character is disclosed in the '595 patent, and other systems more-or-less related to the system disclosed in the '595 patent are disclosed in various ones of the cited references and in the patents cited in column 1 of the patent.

A common disadvantage of heretofore night vision systems is that they are not capable of producing a visual image with sufficient detail under very low level ambient light conditions and/or when the target acquired by the system is very far away or the system has a slow objective lens.

A solution to this problem, disclosed in the '595 patent, employs an invisible light projector or spot illuminator to enhance the ability of the hand held night vision system disclosed in that patent to produce an acceptable visible image under such conditions. This light projector includes a diode which emits light in the invisible, near infrared part of the electromagnetic spectrum. This "invisible" light is focused and projected onto the target acquired by the night vision system. This provides, on that part of the target impacted by the projected beam, additional energy which can be converted by the image intensifier of the system to a visual image.

Although a decided improvement on the theretofore available night vision systems, that system disclosed in the '595 patent does have its drawbacks. The infrared LED is not capable of illuminating a target more than 500 feet (152 m) from the system to a high level; i.e., to a high enough level that the image generated by the intensifier tube will have any significant level of detail unless expensive optics with large apertures and low f numbers are employed.

Another limitation of the system disclosed in the '595 patent, which may be disadvantageous in particular circumstances, is that no provision is made for adjusting the "spot" or circle illuminated by the infrared LED with respect to the field of view of the night vision system. Therefore, the user may find that part of the target is adequately illuminated while the rest of it cannot be seen well at all. Alternatively, he might have to train the spot on first one and then another part of the target to see it well; and this is a decided drawback.

SUMMARY OF THE INVENTION

There has now been invented, and disclosed herein, a novel, improved, target illumination device which does not have the disadvantages of the LED-based device disclosed in the '595 patent. This novel target illuminating device employs a laser, typically although not necessarily operating in the covert, near infrared portion of the electromagnetic spectrum, to illuminate the target of choice. As a consequence, detail can be seen in targets acquired by the image intensifier and thus illuminated at distances of up to one-half mile with absolutely no difficulty at all; and the illuminator can be used with night visions systems employing slow, but inexpensive optics. Furthermore, even at considerable distances, one can see in detail the interiors of dark buildings, vehicles, ships, etc. and the contents of such vehicles and structures.

Furthermore, a projection lens of the zoom type is employed to project the coherent energy outputted from the laser. This allows the area covered by that beam to be matched to the target or the objective lens of an associated night vision or other imaging system. As a result, the image produced from the image intensifier will be enhanced uniformly from edge to edge, which is a decided advantage because details can be easily made out even in the edges of the image. And a given illuminating device is compatible with different night vision systems essentially without limitations on the focal length of the objective lens employed in that system.

The target illuminator is a self-contained unit which can be powered from an external source or by rechargeable, onboard batteries. It is, therefore, also useful in applications other than the one just described; e.g., to illuminate a target acquired by an individual or crew served weapon.

In addition to the novel use of a zoom type projection lens to match the beam of energy emitted from the laser to the target or an objective lens, the novel target illumination units disclosed herein feature, inter alia: a novel mounting mechanism which allows the beam to be precisely centered from the exterior of the unit along the longitudinal axis of the projection lens, a pulsed power source which permits the intensity of the emitted energy to be varied, and a fail-safe cover for the projection lens which keeps radiant energy from being outputted in the event that the illuminator is inadvertently turned on. The latter is but one of several features which enable the novel target illuminators disclosed herein to satisfy the requirements of the Food and Drug Administration (FDA) for Class IIIb lasers.

The circuitry for the target illuminator appears on two, internally mounted, printed circuit boards. Salient features are circuits which allow the output from the laser to be varied as mentioned above and which maintain a threshold current flow through the laser when it is in a standby mode so that the laser will output a useful beam of coherent energy when it is turned on rather than bouncing, fluttering, or flashing erratically. Also included in this circuitry is an electrical interlock which must be installed before the target illuminator laser can be operated and thereby enables the disclosed target illuminators to meet yet another FDA requirement.

OBJECTS OF THE INVENTION

From the foregoing, it will be apparent to the reader that one important and primary object of the present invention resides in the provision of novel, improved devices for illuminating a target with a beam of coherent energy, typically energy in a non-visible part of the electromagnetic spectrum.

Other also important but more specific objects of the invention reside in the provision of target illuminators as characterized in the preceding object:

which are admirably suited for surveillance, reconnaissance, weapons aiming systems, and a host of other applications;

which are self-contained and lightweight and can easily be hand held;

which provide energy of a wavelength that can be converted to a visible image by such imaging systems as image intensifiers, infrared image convertors, and infrared sensitive CCD or other cameras;

which employ a laser to generate the radiant energy and which satisfy the FDA requirements for Class IIIb lasers;

which employ a zoom-type projection lens that allows the beam to be matched to the target or to the objective lens of an associated night vision or comparable imaging system;

which employ a variety of systems that provide for safe and optimal operation of the target illuminator and the outputting of a radiant energy beam of adjustable intensity; and which are rugged and relatively insensitive to shocks generated if they are dropped or otherwise mishandled and to the shocks to which they are subjected during the firing of individual and crew served weapons on which they are mounted.

Other important objects and additional features and advantages of the invention will be apparent to the reader from the foregoing and the appended claims and from the ensuing detailed description and discussion of the invention, taken in conjunction with the accompanying drawing.

DETAILED DESCRIPTION OF THE INVENTION

Figure 1:
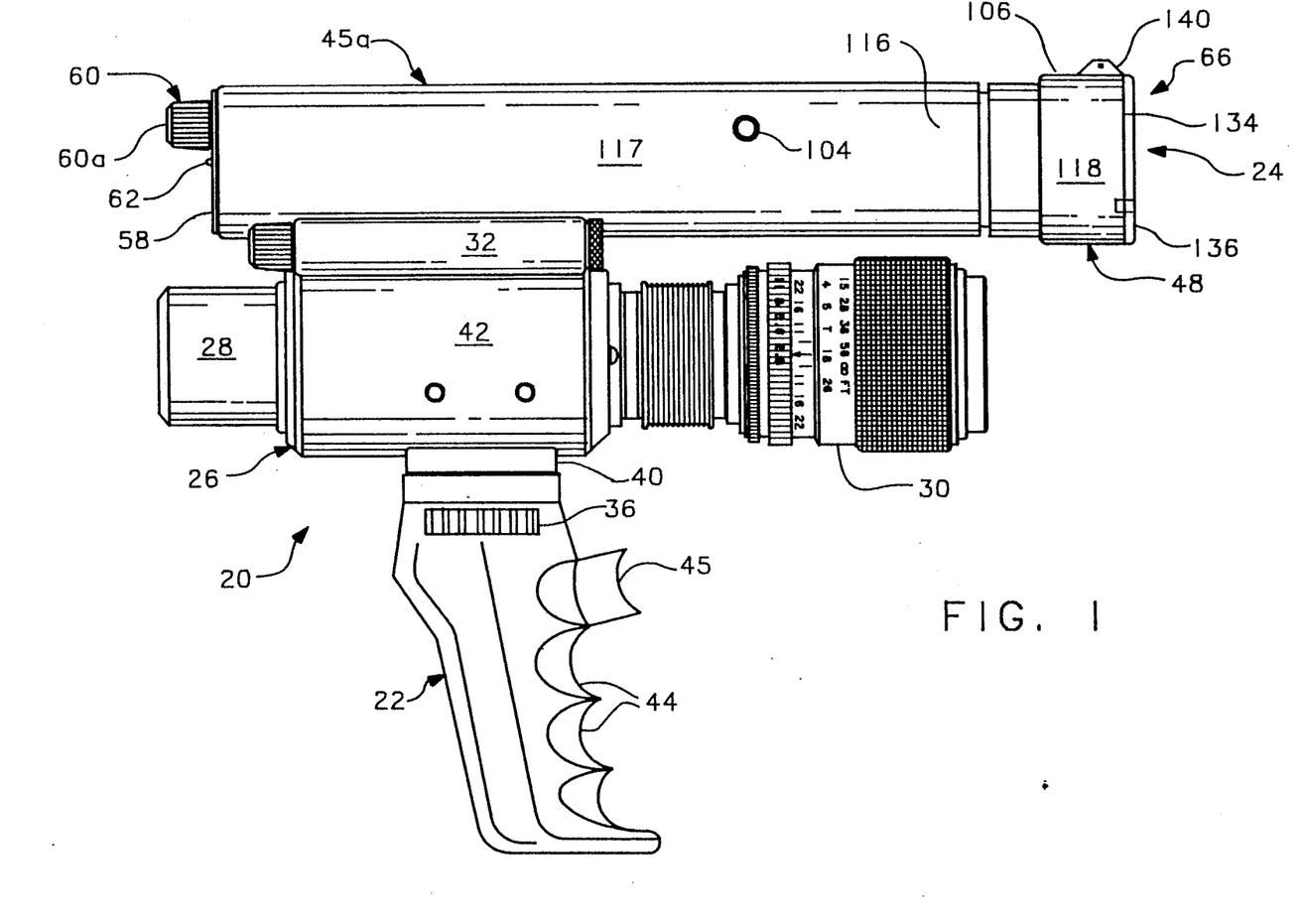
FIG. 1 is a side view of a hand held surveillance system which has an image intensifier and is equipped with a target illuminator employing the principles of the present invention.
Figures 2, 4:
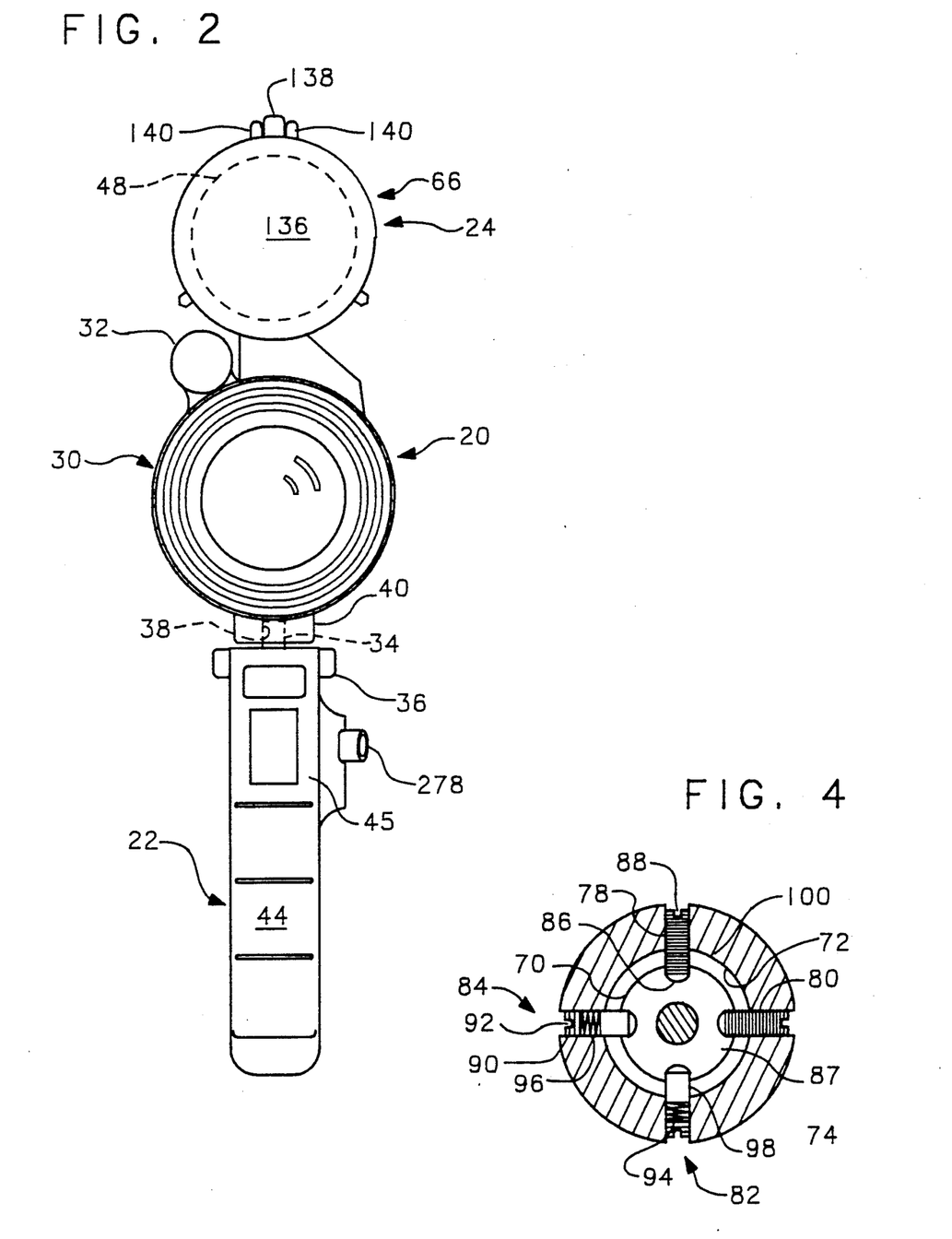
FIG. 2 is a right-hand end view of the surveillance system and target illuminator.
FIG. 4 is a section through the target illuminator, taking substantially along line 4—4 of FIG. 3.

Referring now to the drawing, FIGS. 1 and 2 depict a hand held night vision system 20 mounted on a pistol grip 22 and equipped with a laser illuminator 24 in accord with the principles of the present invention so that all or a selected part of the target can be illuminated and thereby better seen by the user of the night vision system. Laser illuminator 24 has a zoom feature; therefore, that part of the target illuminated by it can be changed at will by the operator of the night vision system and the beam projected by the illuminator can be matched to the field of view of the night vision system optics.

Night vision system 20 includes: an image intensifier 26; an eyepiece 28 assembled to the rear end of the image intensifier tube; an objective lens 30 assembled to the forward end of the tube; and a battery case 32 on the upper side of the intensifier tube and offset to one side thereof. Batteries (not shown) in this case supply the power for operating image intensifier 26.

Objective lens 30 gathers available light, be it starlight, firelight, or other light of low intensity, forming an image of the scene or target at which night vision system 20 is aimed.

This low intensity image is projected onto the input side of a fiber optic plate incorporated in image intensifier 26. This plate is comprised of a bundle of thin optic fibers with ends that define the front and rear surfaces of the plate. Each of the optical fibers passes an element of the image formed on the input surface to a photocathode on the rear surface of the fiberoptic plate. This photocathode is sensitive to radiant energy in the visible and near infrared parts of the electromagnetic spectrum. The resulting image formed on the photocathode is therefore a mosaic of such elements. The photocathode emits electrons in a spatial pattern corresponding to the optical image formed upon it.

The electrons emitted from the photocathode impinge on the input surface of a microchannel disk, also a component of image intensifier 26. This component consists of microscopic, hollow, electron-conducting channels fused into a disk-shaped array. Voltage is applied across the disk faces so that each microscopic channel acts as a separate, high gain, electron multiplier. The voltage is supplied by the batteries housed within the battery case 32 atop the image intensifier 26.

When an electron impinges upon a microchannel surface, secondary electrons are generated. The secondary electrons are accelerated through the channels by the applied voltage, colliding with the channel surfaces to dislodge additional secondary electrons, thereby producing electron multiplication. By varying the voltage across the disk, the gain of the multiplier can be controlled.

The electrons impinge upon a phosphor screen deposited on the front surface of a fiberoptic output plate, generating an enhanced image of the scene targeted by night vision system 20. The fiberoptic output plate is comprised of a bundle of optical fibers which relay the image to a back or output face of the plate. The back (output) face of the plate is rotated 180° with respect to its front (input) face to invert the image produced by objective lens 30.

An image intensifier 26 of the type described above is produced by the Litton Electron Tube Division of Litton Systems, Inc., Tempe, Ariz. and identified by that company as Image Intensifier Tube Model L-4261. Other image intensifiers can of course be substituted for the one described above. Image intensifiers are available from a number of commercial sources.

The intensified image of the target, formed at the output surface of the fiberoptic plate, is projected by eyepiece 28 to the eye of the viewer (or the eyepiece can be replaced with a camera so that the image can be recorded on film or video tape).

Pistol grip 22 is attached to the just-described assembly of objective lens 30, image intensifier 26, and eyepiece 28 by a threaded screw 34 (see FIG. 2) attached, at its lower end, to a knurled knob 36. Screw 34 extends upwardly through pistol grip 22 and into an internally threaded aperture 38. The latter is formed in a mount 40 on the bottom side of the image intensifier casing 42 and can alternatively be employed to support night vision system 20 from a tripod.

Pistol grip 22 has the usual finger rests 44 and a switch-controlling trigger or switch adapter 45 which is depressed to turn activate infrared illuminator 24.

Hand held night vision systems of the character just described are disclosed in detail in above-cited and incorporated U.S. Pat. Nos. 4,707,595 and 4,853,529. As the exemplary night vision system illustrated in FIGS. 1 and 2 is disclosed in detail in the foregoing patents and as the details of that system are not part of the present invention, that system will not be described further herein except as is necessary for an understanding of the present invention.

Figure 3:
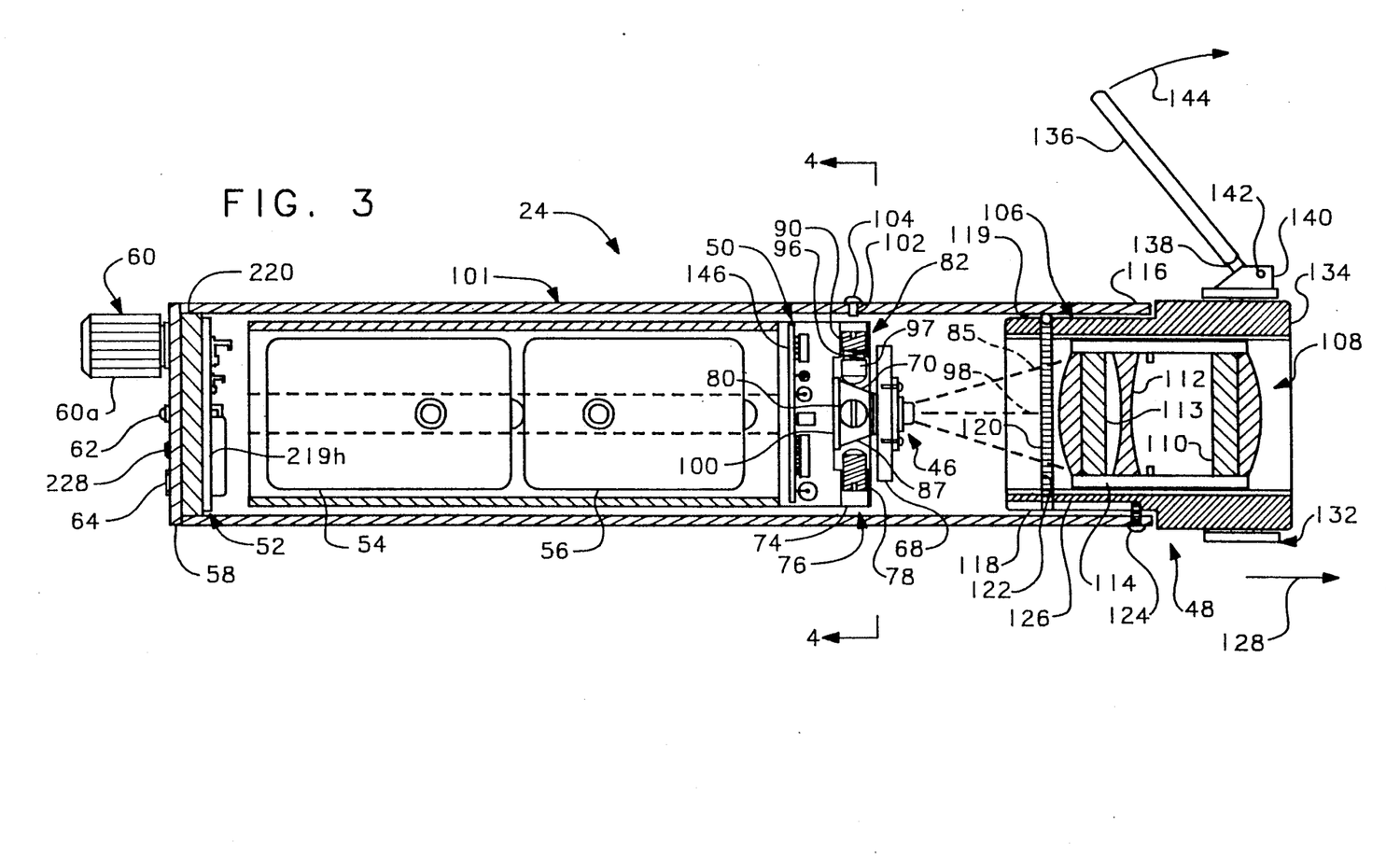
FIG. 3 is a longitudinal section through the target illuminator.

The laser zoom illuminator 24 employed in association with night vision system 20 to increase the intensity of the image available from that system is shown in detail in FIGS. 3 and 4. Turning then to those figures, the major components of the zoom illuminator include an elongated casing 45a housing: (1) a diode-type laser 46 which operates in the near infrared portion of the electromagnetic spectrum and has an emitter section 46a and a photo diode section 46b (see FIG. 6); (2) a push-pull type projection zoom lens 48; (3) a laser driver module 50; (4) a laser terminal module 52 connected to laser driver module 50 by a ribbon-type cable (not shown); and (5) a power supply which includes two stacks 54 and 56 of rechargeable Nicad cells typically capable of supplying enough energy for laser illuminator 24 to operate for as long as ten hours.

Accessible from the exterior of the zoom illuminator and mounted on the rear cover 58 of casing 45a is an intensity control 60 which has: (1) a knob 60a; (2) a 50K potentiometer R60b which is adjusted by knob 60a to control the intensity of the radiation the laser 46 emits; and (3) an of-off switch S60c which is employed to turn the illuminator on and off. Similarly mounted and accessible are a LED 62 which is lighted when the illuminator is turned on and a jack 64 for connecting the Nicad batteries (cell stacks) 54 and 56 to an alternate power source to charge the Nicad cells and/or to operate the laser illuminator on external power.

A final, major component of zoom illuminator 24 is a fail-safe cover 66 which is spring biased to a closed position over projection lens 48. This cover keeps the illuminator from outputting radiant energy in the event that it is inadvertently turned on, thus satisfying yet another FDA requirement for Class IIIb lasers.

Referring still to FIGS. 3 and 4, laser 46 is a commercially obtained component of laser illuminator 24. The illustrated laser illuminator is supplied with either a 50MW or a 100MW laser diode operating at 830 nanometers; e.g., a Sharp Model LT015 MFO.

Laser 46 is mounted on a heat sink, preferably formed of aluminum because of that metal's high thermal conductivity The illustrated heat sink has a circular disk 68 to which laser 46 is attached and an integral platform 70 in the form of a truncated cone.

The assembly of diode 46 and heat sink 68, 70 is mounted in a centralized aperture 72 through a cylindrical support 74 which is one component of laser support and alignment assembly 76. Threaded through support 74 and accessible from the exterior of laser illuminator casing 45a are four components 78, 80, 82, and 84 for aligning the beam 85 of energy outputted from laser 46 with projection lens 48 and for securely retaining the laser in the selected alignment.

The four laser alignment components 78, 80, 82, and 84 are spaced at 90° intervals around cylindrical support 74 with the longitudinal axes of the four components lying in the same plane and extending through the axis of symmetry of support 74. Two of these components (78 and 80) are threaded studs with tapered inner ends 86 configured to match and firmly engage the surface 87 of frustoconical heat sink element 70 and screwdriver engageable slots 88 in their outer ends.

Paired with, and opposite, studs 78 and 80 are the remaining laser alignment components 80 and 82. Each of these is an assembly of: (1) a threaded retainer 90 which has a screwdriver engageable slot 92 in its outer end and is threaded into an outer, internally threaded section of a radial bore 94 through cylindrical support 74 (the threads are not shown); (2) a spring 96 trapped beneath retainer 90 in an unthreaded section of bore 94; and (3) a pin 97. Each pin 97 has a tapered inner end 97a also engaging and configured to match the external surface 87 of heat sink platform 70.

As will be apparent to the reader from the foregoing, pins 97 are loaded by springs 96, thereby securely holding the heat sink 68, 70 on which laser 46 is mounted against the tapered inner ends 86 of locating and alignment studs 78 and 80. Thus, by backing off or advancing threaded stud 78, laser 46 can be moved up and down. Similarly, by backing off and advancing stud 80, the laser can be adjusted from side-to-side. Thus, the diode is easily and readily adjusted so that the centerline 98 of the radiant energy beam 85 propagated from the laser is aligned with the longitudinal axis of symmetry of projection lens 48.

.Apertures through which a screwdriver can be inserted to adjust alignment studs 76 and 78 and bias adjusting, spring retainers 90 are formed in the elongated, cylindrical barrel 101 of laser illuminator casing 45a opposite the outer ends of the alignment studs and the associated assemblies 80 and 82. One of these apertures is shown in FIG. 3 and identified by reference character 102. Once the adjustment process is completed, plugs 104 are installed in these openings to keep moisture, dust, and other foreign material from penetrating to the interior of casing 45a.

The threaded retainers 90 of assemblies 82 and 84 are significant. They allow the force with which the heat sink, laser assembly is biased against locating studs 78 and 80 to be easily adjusted.

A radial, integral ridge 100 is formed at the rear end of heat sink element 70. This ridge keeps the laser/heat sink assembly from being forceably expelled from support 74 if laser illuminator 24 is subjected to shock, for example, by recoil in those applications in which the laser illuminator is employed with a rifle, machine gun, or other firearm for target illumination purposes.

Referring now specifically to FIG. 3, projection lens 48 is employed to focus the energy supplied by laser 46 and to project the focused energy on the target at which zoom illuminator 24 is aimed, this capability being provided by employing a projection lens of the push-pull zoom type. And, as discussed above, lens 48 can be "zoomed" (image enlarged or reduced in size) to match beam 85 to a particular objective lens 30 of night vision system 20, thereby allowing the field of view of that lens or any part of the field to be uniformly illuminated from edge to edge.

Projection lens 48 is conventional and commercially obtainable. For these reasons, it will not be described in any great detail herein. Basically, however, it includes a lens housing 106 and a triplet lens assembly 108. This assembly has a front plano-convex element 110, a double concave element 112, and a rear plano-convex element 113, all mounted in spaced apart, fixed relationship in a support 114. The illustrated lens assembly has the advantage that it provides a wide zoom range, yet keeps the beam 85 sharply focused all of the way to the edge of beam over this entire range.

Projection lens 48 is installed in the open, front end section 116 of the barrel 101 of zoom illuminator casing 45a. Two, or even three, O-rings are employed to keep foreign material from penetrating between projection lens 48 and barrel 101 into the interior of casing 45a and to allow projection lens 48 to move smoothly as it is zoomed; i.e., shifted back and forth in casing 45a. These O-rings fit into grooves machined in the exterior surface 118 of lens housing 106 and extend from that housing to the inner surface 119 of barrel 101. One of these O-rings is illustrated in FIG. 3 and identified by reference character 120. The circumferential groove in which that O-ring is installed is identified by reference character 122.

As is also shown in FIG. 3, a screw 124 is threaded through the front section 116 of barrel 101 into a longitudinally extending, rectilinear groove 126 machined into the outer surface 118 of lens housing 106. This screw keeps projection lens 48 from rotating in barrel 101. Also, it limits the travel of the lens as it is zoomed in and out. Specifically, projection lens 48 is shown in a position of maximum retraction in FIG. 3. In this position, it projects a beam 85 of maximum diameter. As projection lens 48 is zoomed in the direction indicated by arrow 128, beam 85 becomes progressively smaller in diameter until projection lens 48 reaches maximum zoom. This occurs when O-ring 120 engages screw 124, preventing further, forward movement of the projection lens.

Retainer or screw 124 also keeps the user from removing zoom lens 48 from laser illuminator casing 45a, thereby enabling laser illuminator 24 to meet another FDA requirement for Class IIIb lasers.

Referring still to FIG. 3, the cover assembly 66 employed to prevent inadvertent exposure to energy propagated from projection lens 48 includes: (1) a cylindrical mounting bracket 132 surrounding and assembled to the front end 134 of projection lens housing 106; (2) a cover element 136 pivotably supported by an integral tang 138 between lugs 140 on cylindrical bracket 132 by a pivot pin 142; (3) a spring (not shown) which biases cover element 136 to a closed, fail-safe position over lens 48 as suggested by arrow 144; and (4) a latch (likewise not shown) for retaining the cover in the open position shown in FIG. 3.

Figure 5:
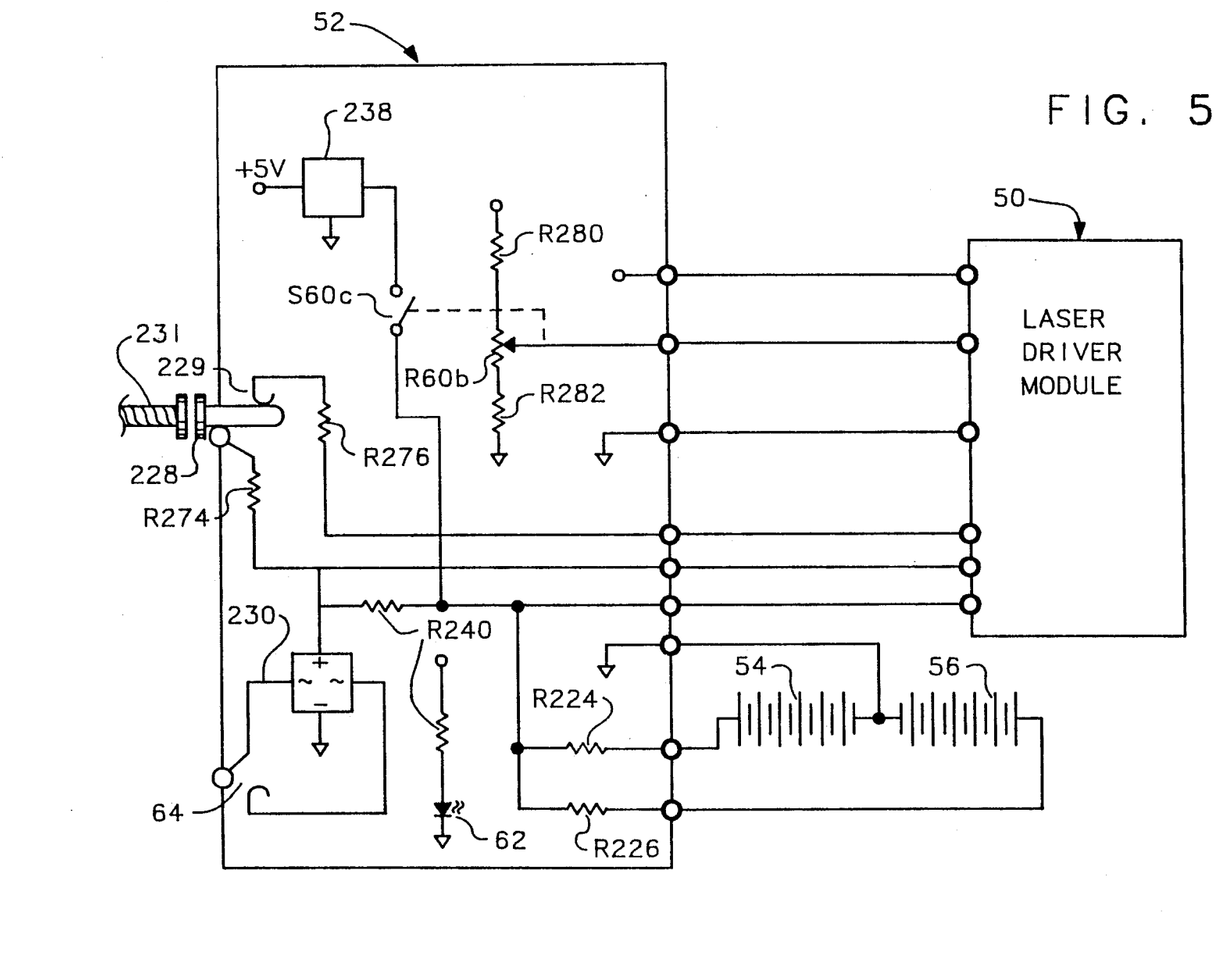
FIG. 5 is a diagram showing a laser driver module employed in the target illuminator in block form and certain power supply circuits in schematic form.

The power supply and operating circuits for laser illuminator 24 are incorporated in the above-mentioned laser driver module 50 (FIG. 6) and in laser terminal module 52 (FIG. 5).

Figure 6:
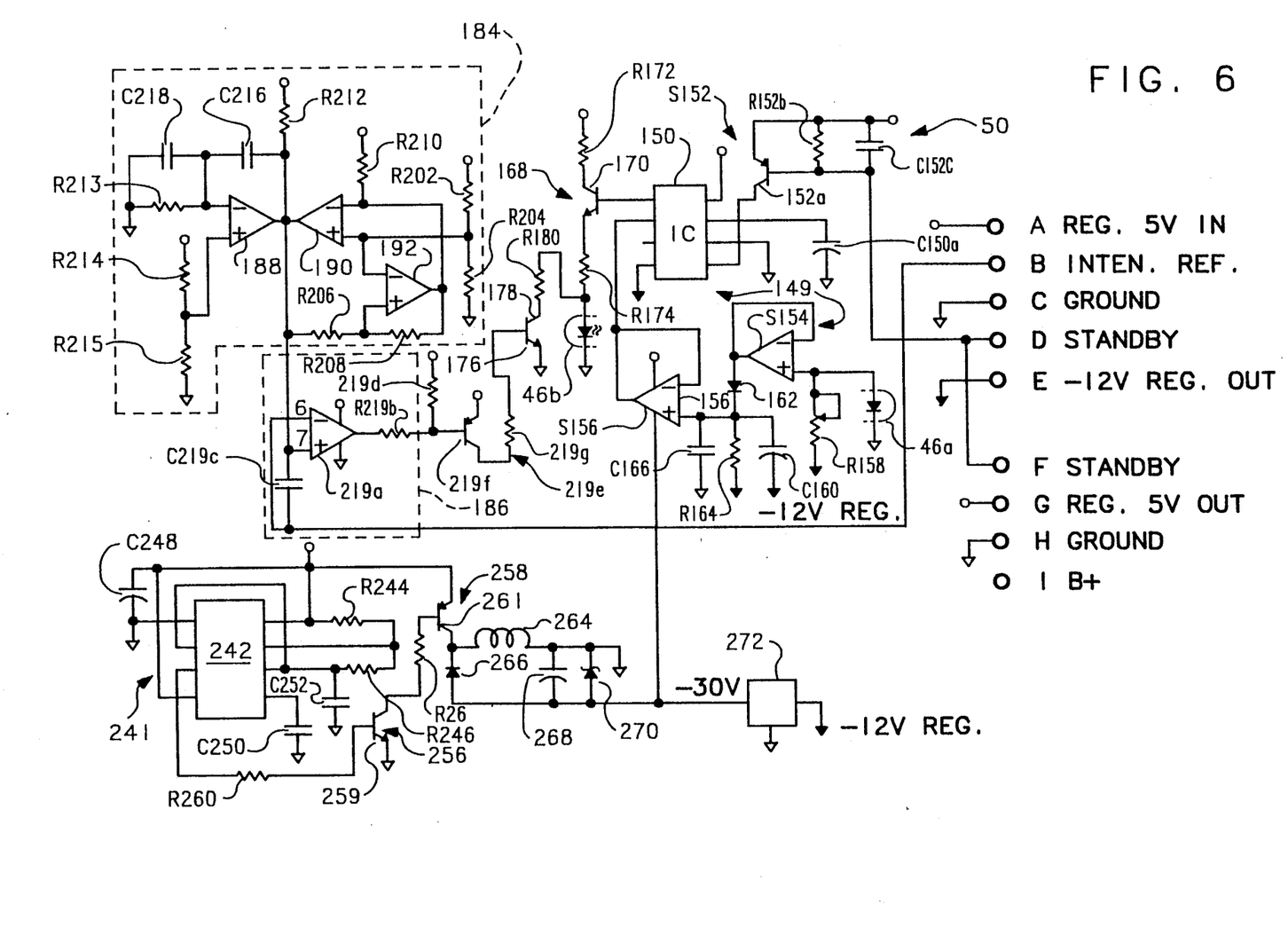
FIG. 6 contains schematics of the laser driver module and the remainder of the power supply.

The following protocols have been employed in FIGS. 5 and 6: (1) heavy circles identify circuit board terminals, (2) light circles represent points at which 5 V is applied, (3) open triangles identify grounds, and (4) solid triangles represent points at which −30 V is applied.

As indicated above, FIG. 6 depicts the circuits incorporated in module 50 and employed to drive laser 46. These are mounted on a board 146 which is installed in the barrel 101 of laser illuminator 24 between batteries 54, 56 and laser support assembly 76.

Incorporated in laser driver module 50 is a peak detector 149 based on an off-the-shelf IR3COIN integrated circuit (IC) 150 and including a capacitor C150a. This IC controls the flow of current to laser 46, using feedback from the laser. A standby switch is provided in this integrated circuit to turn the laser diode on and off.

Reference character S152 identifies the standby switch which includes a transistor 152a, resistor R152b, and capacitor C152c. For laser 46 to be turned on, a +5 V voltage must be applied to pin 5 of integrated circuit 150. This requires that transistor-type, standby switch S152 be made conductive. That is accomplished by making a −12 V voltage available at terminal D of circuit board 146.

The feedback is provided by a peak detector circuit 153 which includes a dual operational amplifier (op amp) with two op amp sections 154 and 156. The dual op amp is connected between laser 46 and pin 2 of integrated circuit 150. The peak detector circuit 153 receives its input from the photo diode section 46b of laser 46, the photo diode generating a current proportional to the output of the laser. This current is buffered in the first op amp section 154 of peak detector circuit 153 which also has an adjustable resistor R158 for matching the laser driver circuitry to the particular laser 46 being employed.

The input current from laser 46 buffered in op amp 154 section of peak detector circuit 153 is employed to charge a capacitor C160 to a level indicative of the peak current outputted from the laser diode. A diode 162 in the peak detector circuit 153 keeps capacitor C160 from discharging back through op amp section 154. A resistor R164 connected in parallel with capacitor C160 provides for slow discharge of the capacitor to pin 3 of the second op amp section 156.

A capacitor C166 in the capacitor discharge path shunts high frequency AC components of the current discharged from capacitor C160 to ground, thereby reducing parasitic oscillation of the second op amp section 156, which is connected in conventional fashion as a voltage follower.

It is the output from the voltage follower section 156 of the dual op amp which is fed to pin 2 of integrated circuit 150. The integrated circuit employs this signal to derive an averaged, operating current level for diode 46. This averaged signal is outputted from pin 1 of integrated circuit 150 to a current booster circuit 168 employing an n-p-n transistor 170 and fixed resistors R172. Resistors R172 and R174 respectively allow laser 46 to be operated continuously and limit that part of the duty cycle for which laser 46 can be turned on to a minimum of 20%. Circuit 168 boosts the 100 milliampere maximum current supplied by IC 150 to a level needed for the operation of laser diodes with an output of 100MW or higher. For laser illuminators as described herein with outputs below 100MW, circuit 168 can be omitted.

The output side of current boosting circuit 168 is connected in parallel: (1) to a switching or shunt circuit 176 consisting of a n-p-n transistor 178 and a biasing resistor R180, and (2) to laser 46.

During the off part of its duty cycle, switching circuit transistor 178 is non-conductive, and all of the current from current booster circuit 168 flows to laser 46. This turns the laser on for the off part of the shunt circuit duty cycle.

In the second, on part of its duty cycle in which transistor 178 is conductive, switching circuit 176 shunts all but a minimum threshold current from laser 46; and the laser is therefore turned off and relegated to a standby status during the on part of the shunt circuit duty cycle.

The maintenance of a threshold current flow through laser 46 when it is in the standby mode is significant. Absent this current flow, the laser will bounce, flutter, or flash erratically when it is turned on instead of outputting a useful beam of coherent energy. The requirement that a threshold current to laser diode 46 be maintained means that resistor R180 must be matched to the output of the particular laser 46 that is employed in laser illuminator 24 or that it be replaced with a variable resistance. Fixed resistors that have proven satisfactory in the exemplary laser illuminator disclosed herein are 27 ohms for a 50MW laser and 6.8 ohms for a 100MW laser.

The operation of switching circuit 176 is controlled by a ramp generator/pulse modulator 184 and a comparator 186. Ramp generator 184 is a conventional circuit and will not be described in detail herein except to note that it includes op amps 188, 190, and 192 together with their attendant, conventionally connected resistors R202 . . . R215 and capacitors C216 and C218.

The inputs to ramp generator/pulse modulator 184 are a +5 V reference voltage and an adjustable voltage which appears at terminal B on circuit board 146 (see FIG. 3). This voltage is controlled by rotating the combined on-off switch and intensity control knob 60a as shown in that figure to vary the resistance across potentiometer 60b.

The output from ramp generator/pulse modulator 184 of course has a waveform with one portion which exhibits a linear variation of current with time and a second, flyback portion. As shown in FIG. 5, the above-mentioned comparator 186 to which this signal is transferred includes an op amp 219a and a resistor R219b. The ramp generator output signal is applied to terminal 7 of the comparator op amp 219a along with a signal obtained by connecting intensity control terminal B on board 146 to pin 7 of op amp 219a through a capacitor C219c. The intensity control voltage is also applied to the second input 6 of op amp 219a.

Comparator 186 outputs a signal which is dropped by a resistor R219d and buffered by a conventional buffer circuit 219e which employs a n-p-n transistor 219f and a resistor R219g. The buffered output from buffer circuit 219e is employed to turn on shunt switch 176 and shunt all but the constantly maintained threshold current away from laser 46. The laser therefore remains off until the output from ramp generator/pulse modulator 184 drops below the reference voltage and switch 176 is thereby turned off (or made non-conductive), allowing a full flow of current to the laser diode from pin 1 of integrated circuit 150. Thus, if intensity control knob 60a is rotated to a "high" setting, comparator 186 will output a signal earlier in the duty cycle of ramp generator/pulse modulator 184; and switch 176 will be turned off (i.e., become non-conductive) earlier in the duty cycle, allowing operating current to flow to laser 46 for a greater part of that cycle. The converse is true if knob 60a is rotated to a lower setting.

In a typical application of the present invention, laser 46 will typically be pulsed (turned on and then off) at a rate of at least 50 to 60 pulses per second. Thus, if the laser is turned on for even the minimum 20° of the duty cycle, the target will appear to the human eye to be constantly illuminated.

Depending upon the application to which laser illuminator is put, continuous as opposed to pulsed operation of the laser may be preferred. This can be accomplished by rotating control knob 60a to its highest setting as discussed above or by eliminating intensity control altogether. The latter approach has the advantage of making the laser illuminator simpler and less expensive to produce.

The power source which is employed to operate laser 46 by way of the circuitry just described can be either an external AC or DC source (not shown) or the two illustrated stacks 54 and 56 of Nicad cells which generate a nominal 7.2 volts per stack. The power supply circuitry is in part mounted on both board 146 of laser driver module 52 and in part on the board 219h of terminal module 52. The latter is suspended by a typically aluminum back plate 220 from the rear cover 58 of laser illuminator 24 (see FIG. 3).

The power supply circuitry, thus shown in both FIG. 5 and in FIG. 6, includes two ballast resistors R224 and R226 which are connected in parallel and employed to balance the outputs from the two stacks 54 and 56 of Nicad cells in those circumstances in which laser illuminator 24 is operated on internal power. Resistors R224 and R226 also keep batteries 54 and 56 from being shorted and are used as charging resistors to limit the current into the batteries when laser illuminator 24 is operated on external power.

External power is applied through jack 64 to a full wave rectifier 230, which makes the jack polarity independent and also allows either an AC or DC external source to be employed. This jack is polarity independent because a positive voltage always appears at the output terminal of rectifier 230.

Irrespective of whether it is supplied from an external or the internal source, the power for operating laser illuminator 24 is routed to an interlock which includes a key plug 228 and a jack 229 in which key plug 228 can be installed.

In night vision system 20, key plug 228 is installed on the patch cord 231 used to connect illuminator 24 to the switch actuator 45 of pistol grip 22. The laser 46 of laser illuminator 24 cannot be turned on unless plug 228 is installed and the trigger operated switch closed by an operator. In other applications a separate, manual activation plug functionally identical to key plug 228 replaces the latter.

Until key plug 228 is installed, all electrical systems of the laser illuminator will remain in a standby mode, and power will not be available to laser 46. The requirement that key plug 228 or its equivalent be installed before laser 46 will operate enables laser illuminator 24 to meet a further FDA requirement for Class IIIb lasers.

As shown in FIG. 5, key plug jack 229 is connected through ballaster balancing resistors R224 and R226 to standby and $-12$ V terminals D and E on laser terminal module board 219h, thus, by the above-mentioned ribbon cable, to the corresponding terminals on the board 146 of laser driver module 50. Consequently, with on-off/intensity control 60 turned on, the operation of laser 46 will be controlled by pistol grip trigger or switch actuator 45 with the operating circuitry for the laser being moved out of the standby mode so that the laser can be turned on only when the switch controlling trigger 45 is depressed.

The output from rectifier 230 is applied through a current-limiting resistor R234 to terminal I on board 219h or the output from balancing resistors R224 and R226 is applied to terminal I, depending upon whether the laser illuminator is being operated on external or internal power. The operating voltage is also applied to the potentiometer R60b of intensity control 60. Therefore, with the on-off switch S60c of the intensity control closed, operating current is supplied to an off-the-shelf voltage regulator 238 which outputs current at a constant $+5$ volts. This current is conducted through the above-mentioned ribbon cable to laser driver module 50 to operate laser 46 and the other circuits in that module.

Referring still to FIG. 5, the LED 62 on the rear cover 58 of laser illuminator casing 45a is turned on whenever the $+5$ V output from voltage regulator 238 is present. A current-limiting resistor R240 connected in series with diode 62 results in the diode outputting light at a low level. This is significant in that it keeps the light outputted from that diode from interfering with an operator's night vision and/or from being visible at more than a very short distance to others in the vicinity.

Referring again to FIG. 5, the laser illuminator power supply also includes an astable multivibrator 241 built around an LM555 integrated timing circuit 242 and also including resistors R244 and R246 and capacitors C248, C250, and C252 hooked up in a conventional manner to configure the IC as a multivibrator.

Astable multivibrator 241 outputs a train of pulses of a size and shape in part dictated by the values of the just identified resistors and capacitors to n-p-n transistor-based circuits 256 and 258. Transistor circuit 256 is made up of a transistor 259 and a current-limiting resistor R260. It buffers the output of multivibrator 241. Circuit 258, which includes transistor 261 and resistor R262, is a switch. The switch is turned on and off by pulses outputted from buffer circuit 256.

During the brief periods that transistor-based switch 258 is closed, $+5$ volts is applied to a typically one millihenry choke 264 which is connected to ground, current therefore building up in choke 264 as long as transistor 261 remains on. When the transistor is turned off, the field collapses, discharging a current through diode 266 and thereby storing a charge in capacitor C268. Subsequent discharge of the capacitor when transistor switch 258 opens results in a discharge which is limited to $-30$ V by zener diode 270. This $-30$ volt output is employed for two purposes. First, it is applied to pin 4 of the op amp section 156 of peak detector circuit 153 as a reference voltage. Second, the $-30$ V signal is applied to a voltage regulator 272 which outputs a $-12$ V operating current for peak detector 149.

As discussed briefly above, there are circumstances in which the available light gathered by the image intensifier 26 of night vision system 20 may not be adequate for the image intensifier to produce a visible image of acceptable quality, due to the lack of available light and/or the range from the hand held system to the target. In this case, laser illuminator 24 can be turned on to illuminate the target with additional electromagnetic energy, and this can be collected by the objective lens 30 of night vision system 20 and utilized by the image intensifier 26 of that system to enhance the visible image viewed through eyepiece 28 or recorded on film or video tape. The intensity of the target illumination is adjusted by intensity control 60 from a maximum of 100% (laser 46 continuously on), typically for a distant target or the widest possible illumination, to a minimum in which laser 46 is only turned on for a minimum of 20% of its duty cycle—typically, when zoom projection lens 48 is fully extended to produce the narrowest possible beam and/or the target is close.

Resistors R280 and R282 limit the on part of the laser operating circuitry duty cycle described above to this 20% minimum.

In using illuminator 24 for the purposes just described and as was mentioned above, a patch cord 231 is connected between the switch controlled by actuator 45 on pistol grip 22 and jack 229. Therefore, the $-12$ V output required to activate laser 46 is not available unless trigger 45 is depressed and the switch is clearly closed. Thus, laser 46 cannot be inadvertently turned on when electrically coupled in the manner just described to with night vision system 20.

Many changes may be made within the scope of the present invention. Certain of these have been discussed above. As a further example, the exemplary Sharp laser may be replaced with one operating in a different part of the electromagnetic spectrum but in the same spectral range as the associated imaging device. Furthermore, the imaging device may be an infrared convertor or a CCD camera instead of an image intensifier. And the invention may be embodied in still other forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed is:

1. A device for illuminating a target or a selected part thereof, said device comprising: a casing; a diode-type laser for generating a beam of coherent energy, said laser being housed in said casing; an optical lens in said casing on the output side of said laser for projecting the beam of coherent energy; and means in said casing for operating said laser, said laser having a standby mode and said laser operating means including means for causing a threshold current to flow through the laser when said laser is in the standby mode, thereby keeping the laser from operating erratically when it is subsequently turned on.

2. A device as defined in claim 1 in which the operating means includes an electrical power source, a first circuit means for connecting said power source to said laser, a second circuit means with higher resistance connectable between said power source and said laser in parallel with said first circuit means, and an electronic switching circuit which connects said power source to said laser via said first circuit means when said laser is turned on and connects said power source to said laser via said second circuit means when the laser is in the standby mode.

3. A device for illuminating a target or a selected part thereof, said device comprising: a casing; a diode-type laser for generating a beam of coherent energy, said laser being housed in said casing; an optical lens in said casing on the output side of said laser for projecting the beam of coherent energy; and means in said casing for operating said laser, said laser operating means including means for adjusting the intensity of illumination by optically controlling the area illuminated by the radiant energy outputted from the laser.

4. A device for illuminating a target or a selected part thereof, said device comprising: a casing; a diode-type laser for generating a beam of coherent energy, said laser being housed in said casing; an optical lens in said casing on the output side of said laser for projecting the beam of coherent energy; means in said casing for operating said laser; and means for regulating the intensity of the radiant energy outputted from said laser, said intensity regulating means including an electrical power supply, first circuit means for converting the output of said power supply to a series of pulses with a selected waveform, and second circuit means for adjusting that part of the first circuit means duty cycle in which electrical energy can flow at an operating level to said laser.

5. A device as defined in claim 4 which includes operator manipulatable means for adjusting that part of the first circuit means duty cycle in which current can flow at the operating level to the laser.

6. A device for illuminating a target or a selected part thereof, said device comprising: a casing; a diode-type laser for generating a beam of coherent energy, said laser being housed in said casing; an optical lens in said casing on the output side of said laser for projecting the beam of coherent energy; means in said casing for operating said laser; and a rechargeable, internal, electrical power source in said casing.

7. A target illuminating device as defined in claim 6 which has means accessible from the exterior of the casing for connecting the device to an external electrical power source in order to operate said laser and to charge the internal power source.

8. A device for illuminating a target or a selected part thereof, said device comprising: a casing; a diode-type laser generating a beam of coherent energy, said laser being housed in said casing; an optical lens in said casing on the output side of said laser for projecting the beam of coherent energy; means in said casing for operating said laser; means for turning said device on and off; and means for providing an operator accessible signal while said device is turned on.

9. A device for illuminating a target or a selected part thereof, said device comprising: a casing; a diode-type laser for generating a beam of coherent energy, said laser being housed in said casing; an optical lens in said casing on the output side of said laser for projecting the beam of coherent energy; and means in said casing for operating said laser, said operating means comprising circuit means for connecting the laser to an electrical power source and an electrical interlock which must be installed before the connection between the power source and the laser can be completed.

* * * * *